United States Patent
Wang

(10) Patent No.: US 11,324,132 B2
(45) Date of Patent: May 3, 2022

(54) HOUSING ASSEMBLY AND ELECTRONIC DEVICE

(71) Applicant: WUHAN CHINA STAR OPTOELECTRONICS SEMICONDUCTOR DISPLAY TECHNOLOGY CO., LTD., Wuhan (CN)

(72) Inventor: Jing Wang, Wuhan (CN)

( * ) Notice: Subject to any disclaimer, the term of this patent is extended or adjusted under 35 U.S.C. 154(b) by 488 days.

(21) Appl. No.: 16/463,848

(22) PCT Filed: Feb. 20, 2019

(86) PCT No.: PCT/CN2019/075619
§ 371 (c)(1),
(2) Date: May 24, 2019

(87) PCT Pub. No.: WO2020/113826
PCT Pub. Date: Jun. 11, 2020

(65) Prior Publication Data
US 2021/0360805 A1    Nov. 18, 2021

(30) Foreign Application Priority Data
Dec. 4, 2018    (CN) .......................... 201811472102.8

(51) Int. Cl.
H05K 5/02    (2006.01)
H04M 1/02    (2006.01)
H05K 5/00    (2006.01)

(52) U.S. Cl.
CPC ........ *H05K 5/0217* (2013.01); *H04M 1/0266* (2013.01); *H05K 5/0017* (2013.01)

(58) Field of Classification Search
CPC . H05K 5/0217; H05K 5/0017; H04M 1/0266; H04N 5/2252
See application file for complete search history.

(56) References Cited

U.S. PATENT DOCUMENTS 5,801,919 A * 9/1998 Griencewic ........... G06F 1/1686
                                                      348/552
6,812,958 B1 * 11/2004 Silvester ............... G06F 1/1607
                                                      348/207.1
(Continued)

FOREIGN PATENT DOCUMENTS

CN    203537435 U    4/2014
CN    106817450 A    6/2017
(Continued)

OTHER PUBLICATIONS

Translation of CN 207491002 (Year: 2021).*

*Primary Examiner* — Hung S. Bui
*Assistant Examiner* — Sagar Shrestha
(74) *Attorney, Agent, or Firm* — JMB Davis Ben-David

(57) ABSTRACT

The present application provides a housing assembly and an electronic device, including a housing, a functional module disposed in the housing. The functional module includes at least a functional component and a rotating shaft, and the functional module is rotatable with respect to the rotating shaft, so that the at least a functional component is rotatable to a position outside the housing. By utilizing rotation of the functional module with respect to the rotating shaft, any of the functional components is rotatable to a position outside the housing, thereby increasing a screen ratio of the electronic device.

7 Claims, 6 Drawing Sheets

(56) References Cited

U.S. PATENT DOCUMENTS

| | | | | |
|---|---|---|---|---|
| 7,432,977 | B2* | 10/2008 | Chiang | G02B 26/0816 |
| | | | | 348/344 |
| 9,124,793 | B2* | 9/2015 | Sheu | H04N 5/2256 |
| 10,306,033 | B1* | 5/2019 | Cheng | H04M 1/0266 |
| 10,659,697 | B2* | 5/2020 | Yang | H04N 5/23296 |
| 10,866,620 | B2* | 12/2020 | Chen | G06F 1/1652 |
| 11,140,249 | B2* | 10/2021 | Chen | G06F 1/1686 |
| 2005/0014527 | A1* | 1/2005 | Chambers | H04N 5/2354 |
| | | | | 455/556.1 |
| 2011/0117958 | A1* | 5/2011 | Kim | H04M 1/0264 |
| | | | | 455/556.1 |
| 2017/0123463 | A1* | 5/2017 | Douglas | G06F 1/1616 |
| 2017/0244903 | A1* | 8/2017 | Yang | H04N 5/232933 |
| 2019/0033926 | A1* | 1/2019 | Huang | H04M 1/0264 |
| 2019/0297174 | A1* | 9/2019 | Leung | H04N 5/2253 |
| 2020/0076992 | A1* | 3/2020 | Wu | H04N 5/232 |
| 2020/0183452 | A1* | 6/2020 | Lin | G06F 1/1622 |
| 2020/0186687 | A1* | 6/2020 | Lin | H04N 5/2253 |
| 2020/0274958 | A1* | 8/2020 | Gong | H04M 1/0264 |
| 2020/0281083 | A1* | 9/2020 | Tang | G06F 1/1686 |
| 2020/0296191 | A1* | 9/2020 | Zeng | H04N 5/2257 |
| 2020/0366851 | A1* | 11/2020 | Zhang | H04N 5/2257 |
| 2021/0051255 | A1* | 2/2021 | Saliev | G03B 30/00 |
| 2021/0223677 | A1* | 7/2021 | Xiang | G06F 1/1605 |

FOREIGN PATENT DOCUMENTS

| | | | |
|---|---|---|---|
| CN | 207491002 U | 6/2018 | |
| CN | 208079148 U | 11/2018 | |

* cited by examiner

HOUSING ASSEMBLY AND ELECTRONIC DEVICE

CROSS-REFERENCE TO RELATED APPLICATIONS

This is the U.S. National Stage of International Patent Application No. PCT/CN2019/075619, filed Feb. 20, 2019, which in turn claims the benefit of Chinese Patent Application No. 201811472102.8 filed Dec. 4, 2018.

BACKGROUND OF INVENTION

1. Field of Invention

The present invention relates to a communication field, and particularly, to a housing assembly and an electronic device.

2. Related Art

With the progress made in electronic technology, electronic devices such as smart phones have become more and more popular and are equipped with more and more functions, such as front camera, face recognition, and infrared sensor functions.

However, such functions have to be performed with certain functional components, while these functional components, such as front cameras and infrared sensors are required to be configured on mobile phone screens, and thus reduce a screen ratio of mobile phone screens.

SUMMARY OF INVENTION

A technical problem to be overcome by the present application is how to improve a screen ratio of electronic devices.

In a first aspect, the present application provides a housing assembly, comprising a housing; a functional module disposed in the housing, wherein the functional module comprises at least a functional component and a rotating shaft, and the functional module is rotatable with respect to the rotating shaft, so that the at least a functional component is rotatable to a position outside the housing, and wherein the functional module further comprising a holding plate having a first surface and a second surface opposite to the first surface, wherein the plurality of the functional components are disposed on the first surface, and the rotating shaft is disposed on the second surface, and wherein the at least a functional component is a camera module, a flash, or a sensor.

In the housing assembly of the present application, the holding plate comprises an arc segment and a straight segment, and two ends of the straight segment are connected to the arc segment, and wherein the arc segment is rotatable about the rotating shaft to a position outside the housing.

In the housing assembly of the present application, the holding plate comprises a first area and a second area disposed corresponding to the first area, and a third area disposed between the first area and the second area, and the functional module comprises a first functional component, a second functional component, and a third functional component, and wherein the first functional component is disposed on the first area, the second functional component is disposed on the second area, the third functional component is disposed on the third area, and the first functional component, the second functional component, and the third functional component are all arranged along the arc segment.

In the housing assembly of the present application, a center of the rotating shaft is coaxial to a center of the arc segment.

In the housing assembly of the present application, the housing assembly further comprises a driving module, wherein the driving module is electrically connected with the functional module, so that the at least a functional component is rotatable to a position outside the housing.

In the housing assembly of the present application, the driving module comprises a driving member disposed in the housing; a control member disposed on an outside of the housing and electrically connected to the driving unit; and a connecting member having one end connected to the rotating shaft, and another end connected to the control member; wherein the control member drives the rotating shaft to rotate through the driving member, so that the at least a functional component is rotatable to a position outside the housing.

In the housing assembly of the present application, the one end of the connecting member forms a connecting hole, wherein the rotating shaft is connected to the connecting hole, and the rotating shaft has an outer contour adapted to a shape of the connecting hole.

In the housing assembly of the present application, the housing is a metal housing, a plastic housing, a ceramic housing, or a glass housing.

In the housing assembly of the present application, the holding plate is made of metal, stainless steel or plastic.

In a second aspect, the present application provides a housing assembly comprising a housing; a functional module disposed in the housing, wherein the functional module comprises at least a functional component and a rotating shaft, and the functional module is rotatable with respect to the rotating shaft, so that the at least a functional component is rotatable to a position outside the housing.

In the housing assembly of the present application, the functional module further comprises a holding plate having a first surface and a second surface opposite to the first surface, wherein the plurality of the functional components are disposed on the first surface, and the rotating shaft is disposed on the second surface.

In the housing assembly of the present application, the holding plate comprises an arc segment and a straight segment, and two ends of the straight segment are connected to the arc segment, and wherein the arc segment is rotatable about the rotating shaft to a position outside the housing.

In the housing assembly of the present application, the holding plate comprises a first area and a second area disposed corresponding to the first area, and a third area disposed between the first area and the second area, and the functional module comprises a first functional component, a second functional component, and a third functional component, and wherein the first functional component is disposed on the first area, the second functional component is disposed on the second area, the third functional component is disposed on the third area, and the first functional component, the second functional component, and the third functional component are all arranged along the arc segment.

In the housing assembly of the present application, a center of the rotating shaft is coaxial to a center of the arc segment.

In the housing assembly of the present application, the housing assembly further comprises a driving module, wherein the driving module is electrically connected with the functional module, so that the at least a functional component is rotatable to a position outside the housing.

In the housing assembly of the present application, the driving module comprises a driving member disposed in the housing; a control member disposed on an outside of the housing and electrically connected to the driving unit; and a connecting member having one end connected to the rotating shaft, and another end connected to the control member; wherein the control member drives the rotating shaft to rotate through the driving member, so that the at least a functional component is rotatable to a position outside the housing.

In the housing assembly of the present application, the one end of the connecting member forms a connecting hole, wherein the rotating shaft is connected to the connecting hole, and the rotating shaft has an outer contour adapted to a shape of the connecting hole.

In the housing assembly of the present application, the functional component is a camera module, a flash, or a sensor.

In a third aspect of the present invention, the present application provides an electronic device comprising a housing assembly; and a display screen disposed on the housing assembly, wherein the housing assembly comprises: a housing; a functional module disposed in the housing, wherein the functional module comprises at least a functional component and a rotating shaft, and the functional module is rotatable with respect to the rotating shaft, so that the at least a functional component is rotatable to a position outside the housing.

In the electronic device of the present application, the functional module further comprises a holding plate having a first surface and a second surface opposite to the first surface, wherein the plurality of the functional components are disposed on the first surface, and the rotating shaft is disposed on the second surface, and wherein the functional component is a camera module, a flash, or a sensor.

The present invention has advantageous effect as follows: by utilizing rotation of the functional module with respect to the rotating shaft, any of the functional components is rotatable to a position outside the housing, thereby increasing a screen ration of the electronic device.

BRIEF DESCRIPTION OF DRAWINGS

In order to more clearly illustrate embodiments or technical solutions in the prior art, the drawings used in the embodiments or the prior art description will be briefly described below. Obviously, the drawings in the following description are only some examples of the application. For those of ordinary skill in the art, without the need for creative labor may, may obtain other drawings from these accompanying drawings.

DESCRIPTION OF PREFERRED EMBODIMENTS

Figure 1:
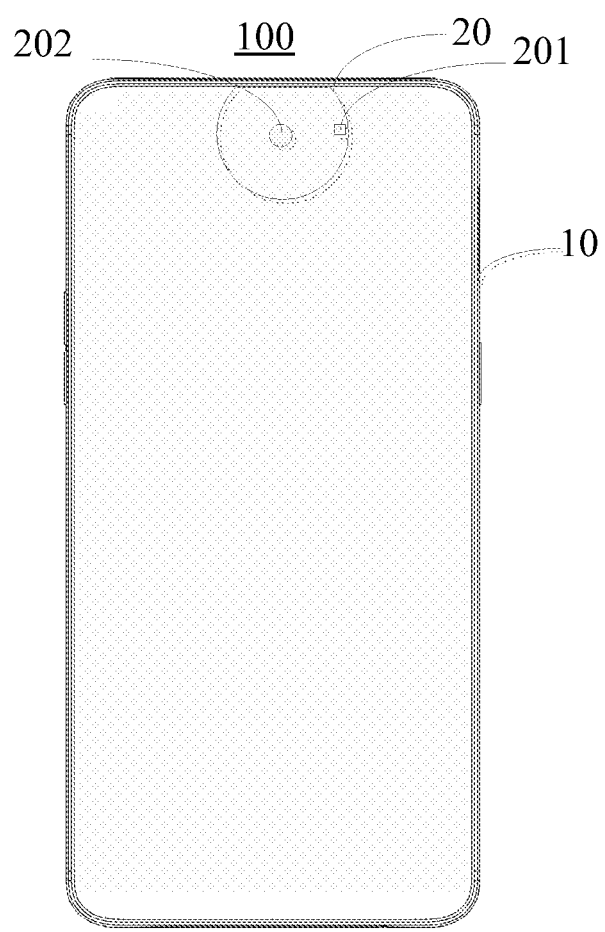
FIG. 1 is a schematic structural view of a housing assembly in accordance with a first embodiment of the present application.

The embodiments of the present application are described in detail below, and the examples of the embodiments are illustrated in the drawings, wherein the same or similar reference numerals are used to refer to the same or similar elements or elements having the same or similar functions. The embodiments described below with reference to the accompanying drawings are intended to be illustrative, and are not to be construed as limitations to the present application.

Please refer to FIG. 1. FIG. 1 is a schematic structural view of a housing assembly in accordance with a first embodiment of the present application. An embodiment of the present application provides a housing assembly 100 including a housing 10, a functional module 20 disposed in the housing 10, wherein the functional module 20 includes a plurality of functional components 201 and a rotating shaft 202. The functional modules 201 each are rotatable with respect to the rotating shaft 202, so that each of the functional component 201 is rotatable to a position outside the housing 10.

For example, the housing 10 can be a metal housing such as a magnesium alloy or a metal such as stainless steel. Certainly, the housing 10 may also be a plastic housing or a ceramic housing. As another example, the housing 10 may include a plastic portion and a metal portion, and the housing 10 may be a housing structure of mutually matched metal and plastic. Specifically, a metal part can be formed first, for example, by forming a magnesium alloy substrate by injection molding. Refilling a plastic on the magnesium alloy substrate to form a plastic substrate, thereby forming a complete housing structure. It should be noted that material and manufacturing process of the housing 10 are not limited thereto, and a glass housing may also be used.

Furthermore, the functional component 210 may be a camera module, a flash, or a sensor, wherein the flash is integrated with the camera module. The sensor may be a distance sensor, an ambient light sensor or an infrared sensor. It should be noted that in this application, the functional module 20 may include a functional component 201 or a plurality of functional components 201. For example, the functional module 20 includes a functional component 201, which is exemplified as a camera module. When the functional module 20 is rotatable with respect to the rotating shaft 202, the camera module is rotatable to a position outside the housing 10 for shooting. As another example, the functional module 20 includes two functional components 201, wherein one of the functional components 201 is a camera module, and another is an infrared sensor. In this manner, the two functional components 201 are switchable according to a practical scenario. Number of the functional components 201 is set depending on actual situation.

In this application, the functional module 20 is rotatable with respect to the rotating shaft 202, so that any one of the functional components 201 is rotatable to a position outside the housing 10, thereby to increase a screen ratio of an electronic device having the housing assembly 100.

Figure 2:
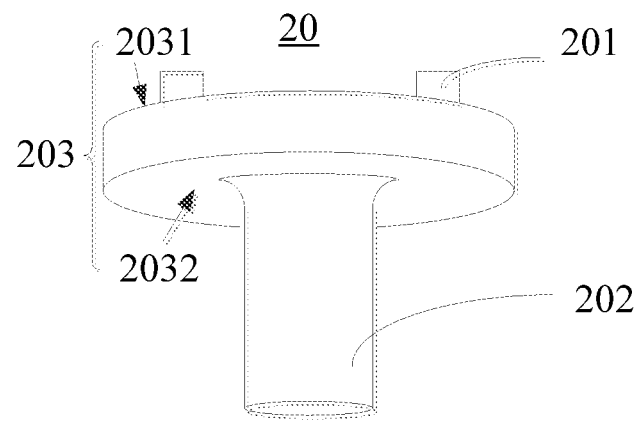
FIG. 2 is a schematic structural view of a functional module of a housing assembly of the present application.

Please refer to FIG. 2. FIG. 2 is a schematic structural view of a functional module of a housing assembly of the present application.

The functional module 20 further includes a holding plate 203 having a first surface 2031 and a second surface 2032 opposite to the first surface 2031, wherein the functional components are 201 are disposed on the first surface 2031, and the rotating shaft 202 is disposed on the second surface 2032.

A material of the carrier plate 203 is metal, stainless steel or plastic, and is specifically determined according to actual conditions. Furthermore, the holding plate 203 is further configured with a plurality of grooves for accommodating the functional components 201. Number of the grooves is equal to that of the functional components 201.

Figure 3:
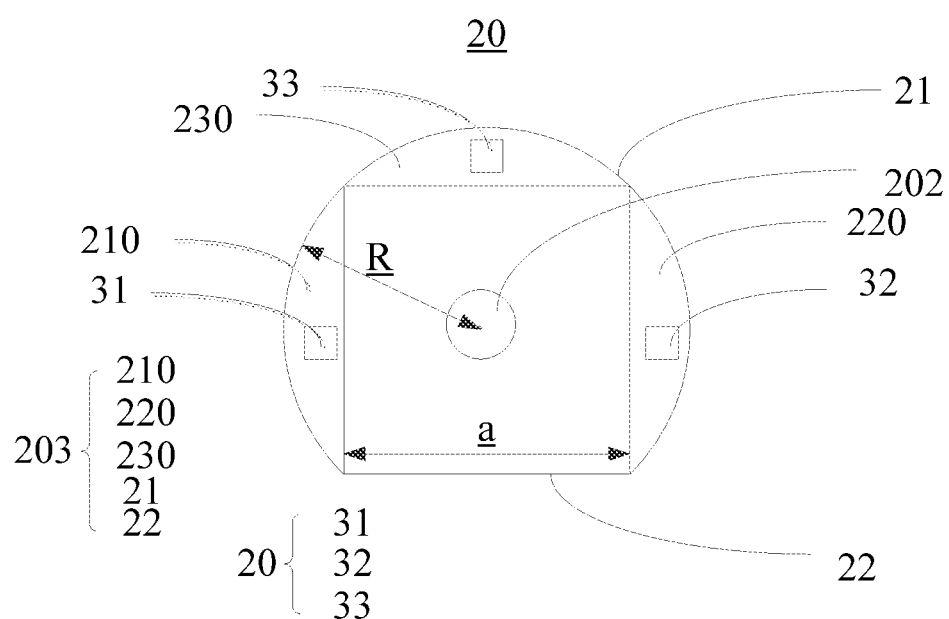
FIG. 3 is a schematic plan view of a functional module of a housing assembly of the present application.

Furthermore, please refer to FIG. 3. FIG. 3 is a schematic plan view of a functional module of a housing assembly of the present application.

The holding plate 203 includes an arc segment 21 and a straight segment 22. Two ends of the straight segment 22 are connected to the arc segment 21, wherein the arc segment 21 is rotatable about the rotating shaft 202 to a position outside the housing 10.

For example, when the arc segment 21 is located inside the housing 10, the straight segment 22 is flush with the housing 10, thereby preventing external impurities such as dust from entering the housing 10. Therefore, a length of the straight segment 22 is set to be proportional to a radius of the arc segment 21 in order to maintain a relation that the straight segment is flush with the housing 10. The radius of the arc segment 21 is defined as R, and the length of the straight segment 22 is a. Furthermore, it should be noted that a center of the rotating shaft 202 is coaxial to a center of the arc segment 21.

Please continue referring to FIG. 3. The holding plate 203 includes a first area 210 and a second area 220 disposed corresponding to the first area 210, and a third area 230 disposed between the first area 210 and the second area 220. The functional module 20 includes a first functional component 31, a second functional component 32, and a third functional component 33. The first functional component 31 is disposed on the first area 210, the second functional component 32 is disposed on the second area 220, the third functional component 33 is disposed on the third area 230. The first functional component 31, the second functional component 32, and the third functional component 33 are all arranged along the arc segment 21.

Figure 4:
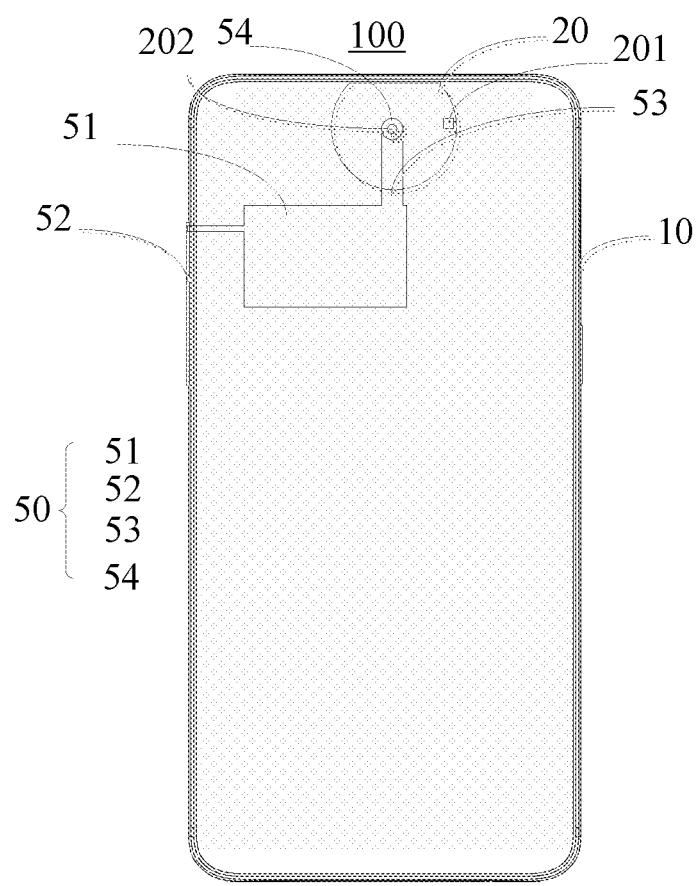
FIG. 4 is a schematic structural view of a housing assembly in accordance with a second embodiment of the present application.

Please refer to FIG. 4. FIG. 4 is a schematic structural view of a housing assembly in accordance with a second embodiment of the present application.

The housing assembly 100 further includes a driving module 50, wherein the driving module 50 is electrically connected with the functional module 20, so that any of the functional components 201 is rotatable to a position outside the housing 10.

The driving module 50 is configured to drive the functional module 20 to rotate with respect to the rotating shaft 202. The driving module 50 includes a driving motor. The driving motor can drive the rotating shaft 202 to rotate over a gear transmission or a belt drive, thereby to allow the rotating shaft 202 to drive the function module 20 to rotate.

Furthermore, please continue referring to FIG. 4. The driving module 50 includes a driving member 51 disposed in the housing 10; a control member 52 disposed on an outside of the housing 10 and electrically connected to the driving unit 51; and a connecting member 53 having one end connected to the rotating shaft 202, and another end connected to the control member 52. The control member 52 drives the rotating shaft 202 to rotate through the driving member 51, so that any of the functional components 201 is rotatable to a position outside the housing 10.

Figure 5:
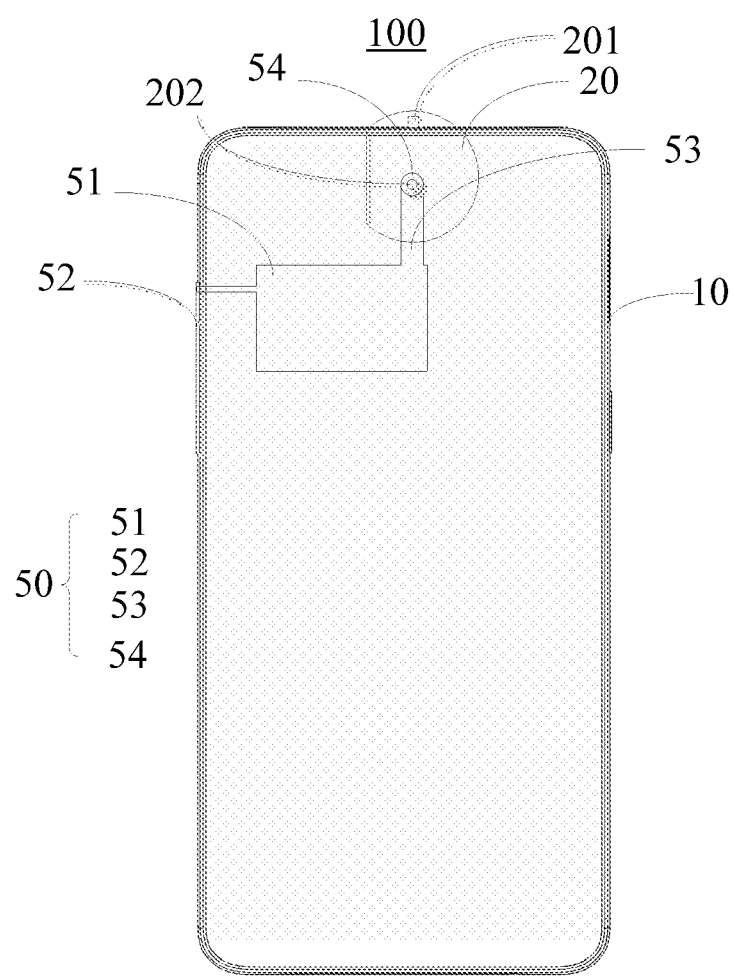
FIG. 5 is a schematic structural view showing a housing assembly in a rotation state of the present application.

For example, please refer to FIG. 5. FIG. 5 is a schematic structural view showing a housing assembly in a rotation state of the present application.

The driving member 51 is exemplified as the driving motor, and the control member 52 is a button provided on an outer side of the housing 10. In an actual scenario, users can press the button (i.e. the control member 52), the drive motor (i.e. the drive component 51) receives a current model, and thereby controls the connecting member 53 to enable rotation of the rotating shaft 202, so as to achieve a purpose that any of the functional components 201 is rotatable to a position outside the housing 10.

Figure 6:
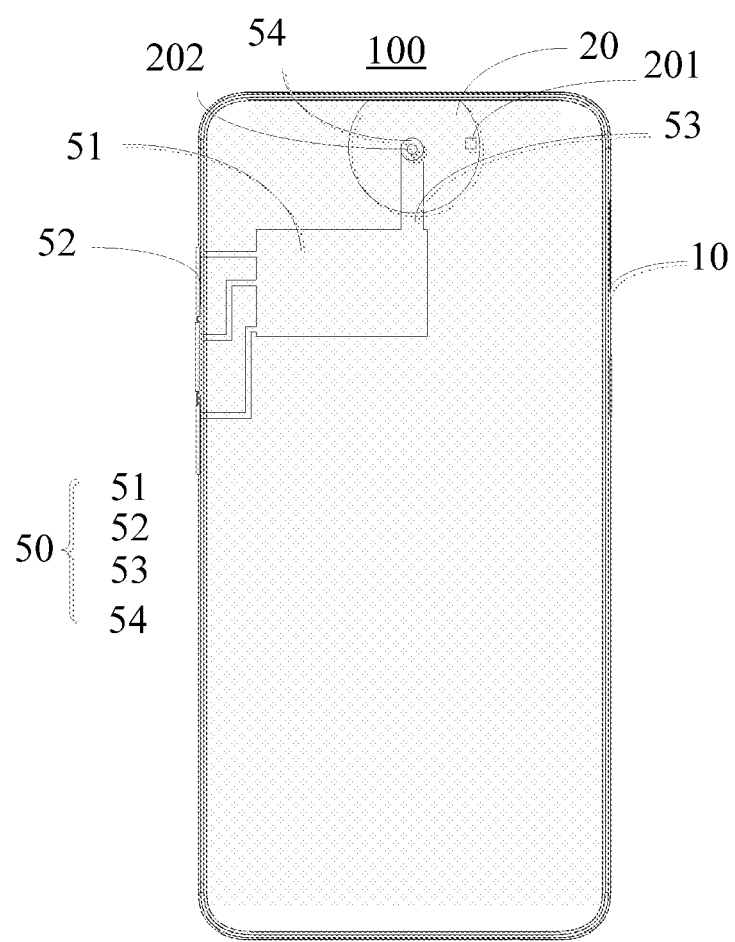
FIG. 6 is a schematic structural view of a housing assembly in accordance with a third embodiment of the present application.

Furthermore, it should be noted that a number of the control member 52 can be one, as shown in FIG. 4, or can also be three, as shown in FIG. 6. When the number of the control member 52 is three, each of the control members 52 is configured to enable rotation of a corresponding functional component 201. Certainly, a number of the control members 52 can be varied as well, and is merely exemplary herein and is not intended to limit the application.

Pleaser continue referring to FIGS. 4 and 5. The one end of the connecting member 53 forms a connecting hole 54, wherein the rotating shaft 202 is connected to the connecting hole 54, and the rotating shaft 22 has an outer contour adapted to a shape of the connecting hole 54.

The connecting hole 54 is configured to be connected to the rotating shaft 202 and to support and rotate the functional module 20. Also, the rotating shaft 22 has an outer contour adapted to a shape of the connecting hole 54, and the outer contour of the rotating shaft 202 is less than an inner wall of the connecting hole 54, so that the rotating shaft 202 can be inserted into the connecting hole 54 for rotation.

Figure 7:
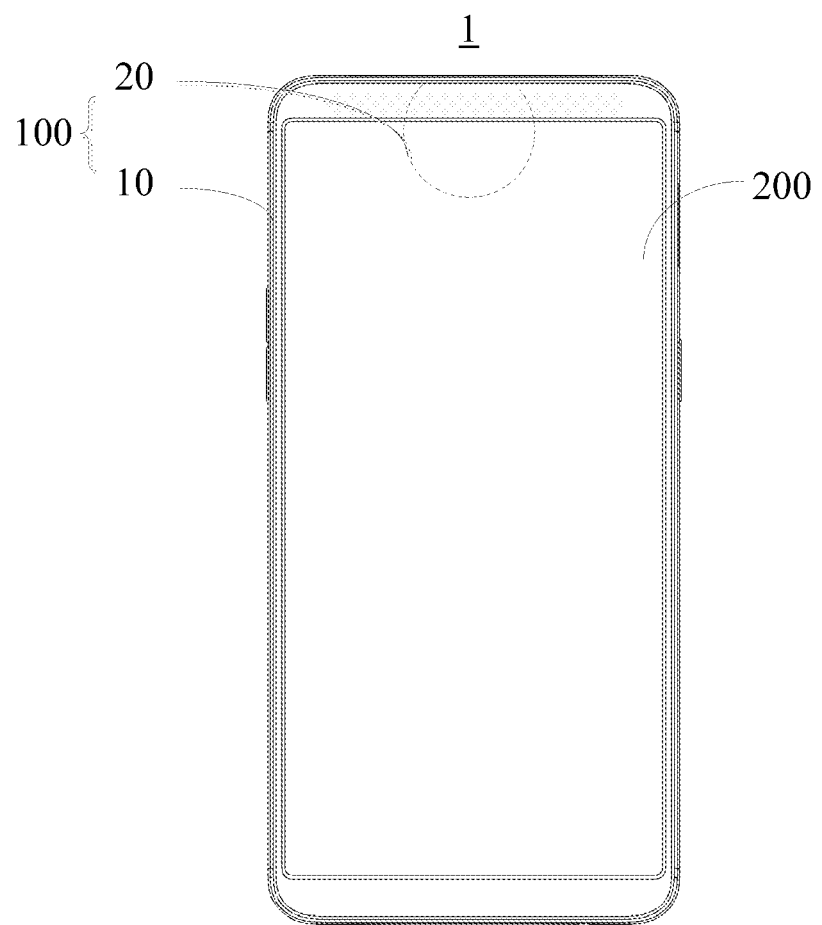
FIG. 7 is a schematic structural view of an electronic device of the present application.

Please refer to FIG. 7. FIG. 7 is a schematic structural view of an electronic device of the present application.

The present application provides an electronic device 1, including a housing assembly 100. A display screen 200 is disposed on the housing assembly 100. The housing assembly 100 includes: a housing 10; a functional module 20 disposed in the housing 10, wherein the functional module 20 includes at least a functional component 201 and a rotating shaft 202, and the functional module 20 is rotatable with respect to the rotating shaft 202, so that the at least a functional component 201 is rotatable to a position outside the housing 10.

The display 200 can be a liquid crystal display (LCD) or an organic light-emitting diode (OLED) display. The display screen 200 is configured to display information such as images and/or text. In certain embodiments, when the display screen 200 is a liquid crystal display, the display screen 200 may include a backlight module, a lower polarizer, an array substrate, a liquid crystal layer, a color filter substrate, and an upper polarizer. When the display screen 200 is an organic light emitting diode display screen, the display screen 200 may include a base layer, an anode layer, an organic layer, a conductive layer, an emission layer, and a cathode layer, which are all sequentially stacked. In certain embodiments, the display screen 200 may be a transparent display screen. The display screen 200 can have a transparent characteristic to allow signals to pass through. The display screen can also be a non-transparent display screen.

It should be noted that the structure of the display screen 200 is not limited thereto. For example, the display screen 200 can be a profiled screen.

Furthermore, for a specific structure of the housing assembly 100, please refer to the above-mentioned embodiments, and details are not reiterated here.

The housing assembly and the electronic device provided by the present application utilize rotation of the functional module 20 with respect to the rotating shaft 202 to allow any of the functional components 201 to be rotatable to a position outside the housing, thereby increasing a screen ration of the electronic device.

The housing assembly and the electronic device provided by the embodiments of the present application are described in detail above. The principles and embodiments of the present application are set forth in the specific examples, and the description of the above embodiments is only for the purpose of understanding the present application. Also, for those skilled in the art, the details and the scope of the application can be changed according to the idea of the present application. In summary, the content of the present specification should not be construed as limiting the present application.

It is understood that the invention may be embodied in other forms within the scope of the claims. Thus, the present examples and embodiments are to be considered in all respects as illustrative, and not restrictive, of the invention defined by the claims.

What is claimed is:

1. A housing assembly, comprising:
   a housing;
   a functional module disposed in the housing and comprising a functional component and a rotating shaft, wherein the functional module is rotatable with respect to the rotating shaft; and
   a driving module electrically connected with the functional module, wherein the driving module comprises a driving member disposed in the housing, a control member disposed on an outside of the housing and electrically connected to the driving unit, and a connecting member having one end connected to the rotating shaft, and another end connected to the control member, wherein the control member drives the rotating shaft to rotate through the driving member, so that the functional component is rotatable to a position outside the housing;
   wherein the one end of the connecting member forms a connecting hole, and the rotating shaft is connected to the connecting hole and has an outer contour adapted to a shape of the connecting hole.

2. The housing assembly of claim 1, wherein the functional module further comprises a holding plate having a first surface and a second surface opposite to the first surface, wherein the functional component is disposed on the first surface, and the rotating shaft is disposed on the second surface.

3. The housing assembly of claim 2, wherein the holding plate comprises an arc segment and a straight segment, and two ends of the straight segment are connected to the arc segment, respectively, wherein the arc segment is rotatable about the rotating shaft to a position outside the housing.

4. The housing assembly of claim 3, wherein a center of the rotating shaft is coaxial to a center of the arc segment.

5. The housing assembly of claim 1, wherein the functional component is a camera module, a flash, or a sensor.

6. An electronic device, comprising:
   a housing assembly; and
   a display screen disposed on the housing assembly;
   wherein the housing assembly comprises:
   a housing;
   a functional module disposed in the housing and comprising a functional component and a rotating shaft, wherein the functional module is rotatable with respect to the rotating shaft; and
   a driving module electrically connected with the functional module, wherein the driving module comprises a driving member disposed in the housing, a control member disposed on an outside of the housing and electrically connected to the driving unit, and a connecting member having one end connected to the rotating shaft, and another end connected to the control member, wherein the control member drives the rotating shaft to rotate through the driving member, so that the functional component is rotatable to a position outside the housing;
   wherein the one end of the connecting member forms a connecting hole, and the rotating shaft is connected to the connecting hole and has an outer contour adapted to a shape of the connecting hole.

7. The electronic device of claim 6, wherein the functional module further comprises a holding plate having a first surface and a second surface opposite to the first surface, wherein the functional component is disposed on the first surface, and the rotating shaft is disposed on the second surface, and wherein the functional component is a camera module, a flash, or a sensor.

* * * * *